(12) United States Patent
Wang

(10) Patent No.: US 10,600,798 B2
(45) Date of Patent: Mar. 24, 2020

(54) MANUFACTURING METHOD OF NON-VOLATILE MEMORY STRUCTURE

(71) Applicant: Powerchip Semiconductor Manufacturing Corporation, Hsinchu (TW)

(72) Inventor: Zih-Song Wang, Taoyuan (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/595,504

(22) Filed: Oct. 8, 2019

(65) Prior Publication Data

US 2020/0035698 A1 Jan. 30, 2020

Related U.S. Application Data

(62) Division of application No. 15/911,176, filed on Mar. 5, 2018, now Pat. No. 10,483,271.

(30) Foreign Application Priority Data

Jan. 4, 2018 (TW) .............................. 107100263 A

(51) Int. Cl.
| | |
|---|---|
| *H01L 27/11556* | (2017.01) |
| *H01L 27/11519* | (2017.01) |
| *H01L 27/11582* | (2017.01) |
| *H01L 27/1157* | (2017.01) |
| *H01L 21/765* | (2006.01) |
| *H01L 23/552* | (2006.01) |

(52) U.S. Cl.
CPC ...... *H01L 27/11556* (2013.01); *H01L 21/765* (2013.01); *H01L 27/1157* (2013.01); *H01L 27/11519* (2013.01); *H01L 27/11582* (2013.01); *H01L 23/552* (2013.01)

(58) Field of Classification Search
CPC ......... H01L 27/11582; H01L 27/11519; H01L 27/11556; H01L 27/1157; H01L 21/765; H01L 23/552
See application file for complete search history.

(56) References Cited

U.S. PATENT DOCUMENTS

| | | | | |
|---|---|---|---|---|
| 5,998,822 | A * | 12/1999 | Wada ................ | H01L 21/76232 257/296 |
| 6,198,151 | B1 * | 3/2001 | Wada ................... | H01L 27/108 257/301 |
| 7,183,607 | B1 * | 2/2007 | Lai ........................ | H01L 27/115 257/316 |
| 7,436,703 | B2 * | 10/2008 | Pham ................. | G11C 16/0483 257/E21.684 |
| 7,643,346 | B2 * | 1/2010 | Toriyama ........... | G11C 16/0483 365/185.17 |
| 9,780,195 | B2 * | 10/2017 | Chu .................. | H01L 27/11565 |
| 2008/0057643 | A1 * | 3/2008 | Aritome ........... | H01L 27/11521 438/257 |

(Continued)

*Primary Examiner* — Savitri Mulpuri
(74) *Attorney, Agent, or Firm* — JCIPRNET

(57) ABSTRACT

A manufacturing method of a non-volatile memory structure including the following steps is provided. Memory cells are formed on a substrate. An isolation layer is formed between the memory cells. A shield electrode is formed on the isolation layer. The shield electrode is electrically connected to a source line.

4 Claims, 13 Drawing Sheets

(56) References Cited

U.S. PATENT DOCUMENTS

| | | | | |
|---|---|---|---|---|
| 2009/0003025 A1* | 1/2009 | Mokhlesi | ............... | G11C 5/063 |
| | | | | 365/51 |
| 2012/0018801 A1* | 1/2012 | Kobayashi | ........ | H01L 27/10823 |
| | | | | 257/334 |
| 2012/0181606 A1* | 7/2012 | Nagai | ............... | H01L 27/10823 |
| | | | | 257/334 |
| 2014/0203344 A1* | 7/2014 | Hopkins | ........... | H01L 29/42324 |
| | | | | 257/316 |
| 2016/0172368 A1* | 6/2016 | Pang | ................ | H01L 27/11556 |
| | | | | 257/314 |
| 2016/0351580 A1* | 12/2016 | Hopkins | ........... | H01L 27/11556 |
| 2019/0088335 A1* | 3/2019 | Hsiung | ............. | G11C 16/0458 |

* cited by examiner

MANUFACTURING METHOD OF NON-VOLATILE MEMORY STRUCTURE

CROSS-REFERENCE TO RELATED APPLICATION

This application is a divisional application of and claims the priority benefit of U.S. application Ser. No. 15/911,176, filed on Mar. 5, 2018, now allowed, which claims the priority benefit of Taiwan application serial no. 107100263, filed on Jan. 4, 2018. The entirety of each of the above-mentioned patent applications is hereby incorporated by reference herein and made a part of this specification.

BACKGROUND OF THE INVENTION

Field of the Invention

The invention relates to a memory structure, and more particularly, to a non-volatile memory structure.

Description of Related Art

A non-volatile memory can perform repeated data operations such as storing, reading, and erasing and has advantages such as retaining stored data when the power supply is interrupted, short data access time, and low power consumption, and has therefore become a widely-adopted memory in personal computers and electronic equipment.

However, as the integrity of the memory device is continuously increased, the coupling interference between the memory cells is also increased, such that the durability and reliability of the memory device are reduced.

SUMMARY OF THE INVENTION

The invention provides a non-volatile memory structure and a manufacturing method thereof that can effectively reduce coupling interference to increase the durability and reliability of a memory device.

The invention provides a non-volatile memory structure including memory cells, at least one isolation layer, and at least one shield electrode. The memory cells are disposed on a substrate. The isolation layer is located between the memory cells. The shield electrode is disposed on the isolation layer and electrically connected to a source line.

According to an embodiment of the invention, in the non-volatile memory structure, the non-volatile memory structure can be a planar non-volatile memory structure.

According to an embodiment of the invention, in the non-volatile memory structure, each of the memory cells can include a charge storage layer, a conductor layer, a first dielectric layer, and a second dielectric layer. The charge storage layer is disposed on the substrate. The conductor layer is disposed on the charge storage layer. The first dielectric layer is disposed between the charge storage layer and the substrate. The second dielectric layer is disposed between the conductor layer and the charge storage layer.

According to an embodiment of the invention, in the non-volatile memory structure, the conductor layer can be further disposed between the charge storage layers, and the second dielectric layer can be further disposed between the conductor layer and the shield electrode.

According to an embodiment of the invention, in the non-volatile memory structure, the isolation layer can be disposed in the substrate between the memory cells and can be disposed between the shield electrode and the substrate.

According to an embodiment of the invention, in the non-volatile memory structure, the isolation layer can include an isolation structure and a liner layer. The isolation structure is disposed in the substrate between the memory cells. The liner layer is disposed between the isolation structure and the substrate and disposed between the shield electrode and the substrate.

According to an embodiment of the invention, in the non-volatile memory structure, the non-volatile memory structure can be a vertical non-volatile memory structure. The vertical non-volatile memory structure can include a stacked structure, a channel layer, and a charge storage structure layer. The stacked structure is disposed on a substrate and can include the at least one shield electrode, gate structures, and the at least one isolation layer. The shield electrode and the gate structures are alternately stacked, and the isolation layer is located between the shield electrode and the gate structures. The channel layer is disposed on a sidewall at a side of the stacked structure. The charge storage structure layer is disposed between the stacked structure and the channel layer.

According to an embodiment of the invention, in the non-volatile memory structure, the memory cells can include the gate structures and a portion of the charge storage structure layer located at a side of the gate structures.

According to an embodiment of the invention, in the non-volatile memory structure, the source line can be disposed on a sidewall at another side of the stacked structure and connected to the substrate. The isolation layer can be further located between the source line and the gate structures.

According to an embodiment of the invention, in the non-volatile memory structure, each of the gate structures can include a metal gate layer and a barrier layer. The barrier layer is located between the metal gate layer and the charge storage structure layer.

The invention provides a manufacturing method of a non-volatile memory structure including the following steps. Memory cells are formed on a substrate. An isolation layer is formed between the memory cells. A shield electrode is formed on the isolation layer. The shield electrode is electrically connected to a source line.

According to an embodiment of the invention, in the manufacturing method of the non-volatile memory structure, the non-volatile memory structure can be a planar non-volatile memory structure.

According to an embodiment of the invention, in the manufacturing method of the non-volatile memory structure, the forming method of each of the memory cells can include the following steps. A first dielectric layer is formed on the substrate. A charge storage layer is formed on the first dielectric layer. A second dielectric layer is formed on the charge storage layer. A conductor layer is formed on the second dielectric layer.

According to an embodiment of the invention, in the manufacturing method of the non-volatile memory structure, the second dielectric layer can be further formed on the shield electrode.

According to an embodiment of the invention, in the manufacturing method of the non-volatile memory structure, the conductor layer can be further formed on the second dielectric layer between the charge storage layers.

According to an embodiment of the invention, in the manufacturing method of the non-volatile memory structure, the forming method of the isolation layer can include the following steps. A trench is formed in a substrate. A liner layer is conformally formed on a surface of the trench. An isolation structure filled in the trench is formed on the liner layer.

According to an embodiment of the invention, in the manufacturing method of the non-volatile memory structure, the non-volatile memory structure can be a vertical non-volatile memory structure. The manufacturing method of the vertical non-volatile memory structure can include the following steps. A stacked layer is formed on the substrate, wherein the stacked layer includes first sacrificial layers and second sacrificial layers that are alternately stacked. A first opening is formed in the stacked layer. The first opening exposes the substrate. A charge storage structure layer is formed on a sidewall of the first opening. A channel layer is formed on the charge storage structure layer. A patterned hard mask layer is formed on the stacked layer. The patterned hard mask layer covers the charge storage structure layer and the channel layer. A second opening is formed in the stacked layer by using the patterned hard mask layer as a mask. The second opening exposes the substrate. The second sacrificial layers exposed by the second opening are removed to form third openings. Gate structures are formed in the third openings. The first sacrificial layers exposed by the second opening are removed to form fourth openings. The isolation layer is conformally formed on a surface of the fourth openings and on the gate structures. The shield electrode is formed on the isolation layer in the fourth openings, and a source line connected to the shield electrode and the substrate is formed in the second openings.

According to an embodiment of the invention, in the manufacturing method of the non-volatile memory structure, the memory cells can include the gate structures and a portion of the charge storage structure layer located at a side of the gate structures.

According to an embodiment of the invention, in the manufacturing method of the non-volatile memory structure, the forming method of the gate structures includes the following steps. A barrier material layer is conformally formed in the third openings. A metal gate material layer filled in the third openings is formed on the barrier material layer. An etch-back process is performed on the metal gate material layer and the barrier material layer.

Based on the above, in the non-volatile memory structure and the manufacturing method thereof provided in the invention, the shield electrode electronically connected to the source line can effectively reduce coupling interference, and therefore the durability and reliability of a memory device can be significantly increased.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
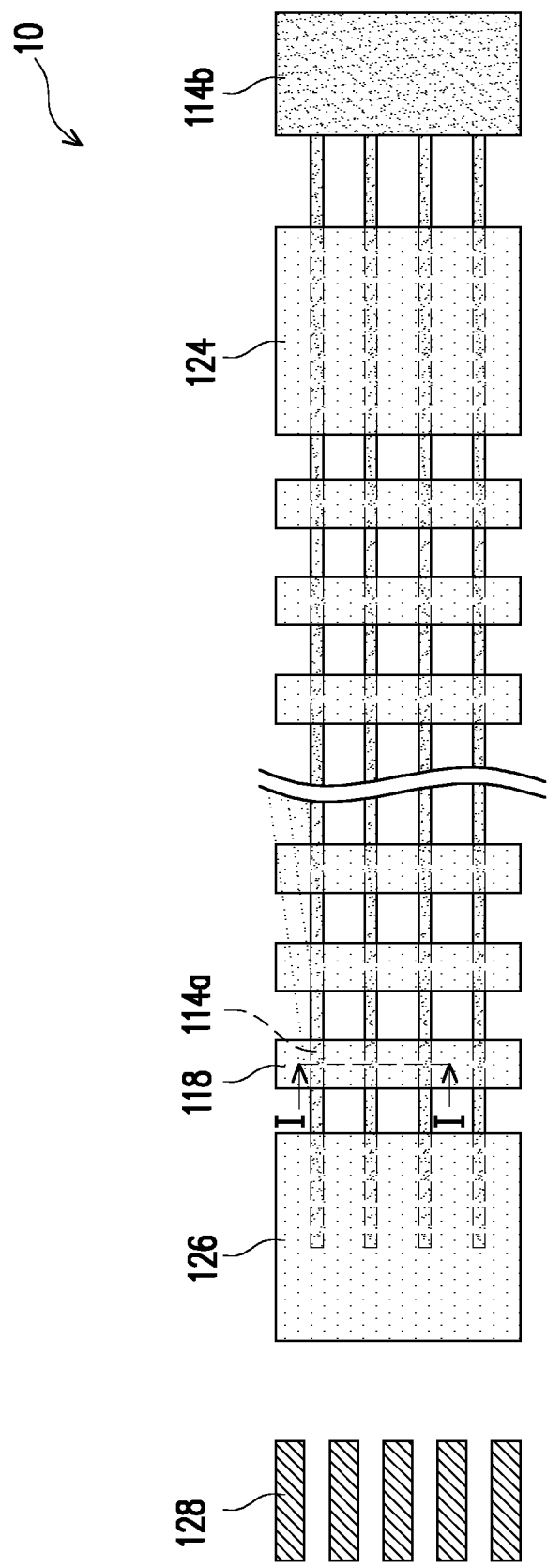
FIG. 1 is a top view of a planar non-volatile memory structure of an embodiment of the invention.

FIG. 1 is a top view of a planar non-volatile memory structure of an embodiment of the invention. FIG. 2A to FIG. 2D are cross sections of a manufacturing process of the planar non-volatile memory structure along section line I-I' in FIG. 1, wherein FIG. 1 is the top view of FIG. 2D, and only the conductive lines and contacts are shown in FIG. 1 to facilitate description.

Figure 2A:
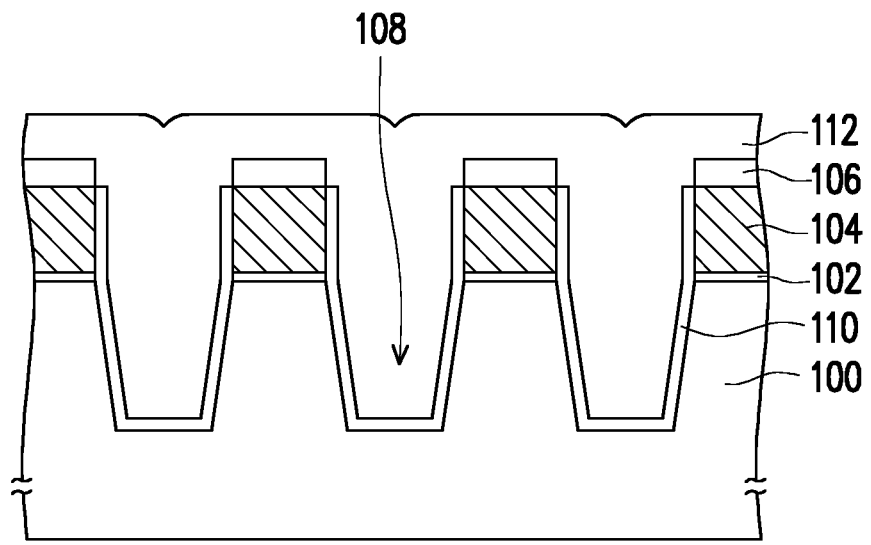
FIG. 2A to FIG. 2D are cross sections of a manufacturing process of the planar non-volatile memory structure along section line I-I' in FIG. 1.

Referring to FIG. 2A, a substrate 100 is provided. The substrate 100 can be a semiconductor substrate such as a silicon substrate. Moreover, based on product design requirement, a desired doped region (not shown) can be formed in the substrate 100.

A dielectric layer 102 can be formed on the substrate 100, a charge storage layer 104 can be formed on the dielectric layer 102, and a hard mask layer 106 can be further formed on the charge storage layer 104. The material of the dielectric layer 102 is, for instance, silicon oxide. The material of the charge storage layer 104 is, for instance, doped polysilicon, and the charge storage layer 104 can be used as a floating gate. The material of the hard mask layer 106 is, for instance, silicon nitride. The forming method of the dielectric layer 102, the charge storage layer 104, and the hard mask layer 106 includes, for instance, forming a dielectric material layer (not shown), a charge storage material layer (not shown), and a hard mask material layer (not shown) on the substrate 100 in order, and then patterning the hard mask material layer, the charge storage material layer, and the dielectric material layer via a lithography process and an etching process. The forming method of the dielectric material layer is, for instance, a thermal oxidation method or a chemical vapor deposition method. The forming method of the charge storage material layer and the dielectric material layer is, for instance, a chemical vapor deposition method.

A trench 108 can be formed in the substrate 100. The forming method of the trench 108 includes, for instance, removing a portion of the substrate 100 by using the hard mask layer 106 as a mask. The method of removing a portion of the substrate 100 is, for instance, a dry etching method.

A liner material layer 110 can be conformally formed on a surface of the trench 108, and the liner material layer 110 can be further formed on the charge storage layer 104 and the dielectric layer 102. The material of the liner material layer 110 is, for instance, silicon oxide. The forming method of the liner material layer 110 is, for instance, a thermal oxidation method.

An isolation material layer 112 filled in the trench 108 can be formed on the liner material layer 110, and the isolation material layer 112 can further cover the hard mask layer 106. The material of the isolation material layer 112 is, for instance, silicon oxide. The forming method of the isolation material layer 112 is, for instance, a chemical vapor deposition method.

Figure 2B:
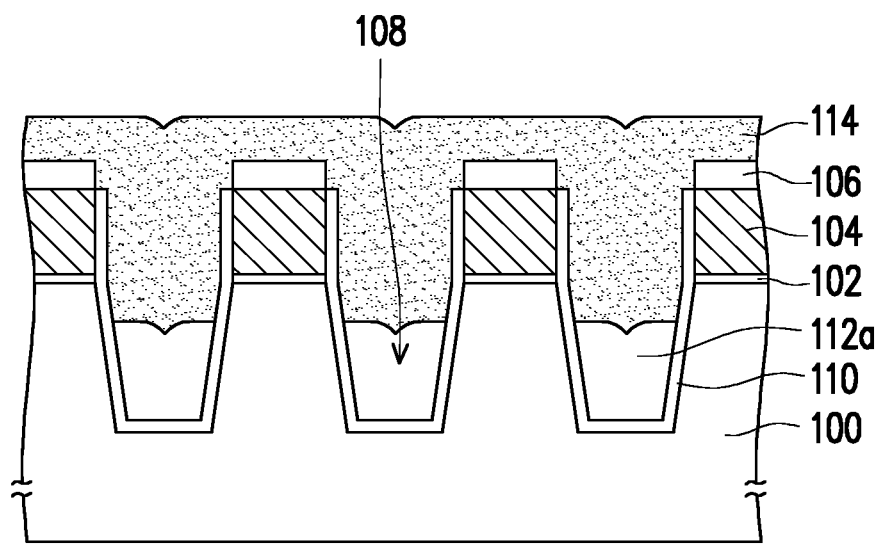

Referring to FIG. 2B, a portion of the isolation material layer 112 can be removed to form an isolation structure 112a filled in the trench 108 on the liner material layer 110. The top surface of the isolation structure 112a can be lower than the top surface of the substrate 100. The method of removing the portion of the isolation material layer 112 is, for instance, an etch-back method or a combination of a chemical-mechanical polishing method and an etch-back method.

A conductor layer 114 can be formed on the isolation structure 112a, and the conductor layer 114 can completely fill the trench 108. The material of the conductor layer 114 can be doped polysilicon or a metal. The forming method of the conductor layer 114 is, for instance, a chemical vapor deposition method or a physical vapor deposition method.

Figure 2C:
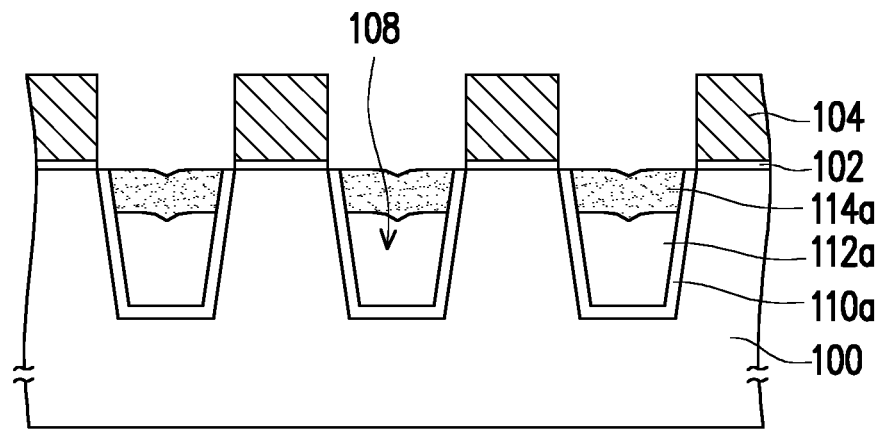

Referring to FIG. 2C, a portion of the conductor layer 114 can be removed to form a shield electrode 114a on the isolation structure 112a. The shield electrode 114a is electrically connected to a source line 114b (refer to FIG. 1). The method of removing the portion of the conductor layer 114 includes an etch-back method or a combination of a chemical-mechanical polishing method and an etch-back method. Moreover, the source line 114b and the shield electrode 114a can be formed by the same conductor layer 114.

The hard mask layer 106 can be removed. The method of removing the hard mask layer 106 is, for instance, a dry etching method or a wet etching method.

The liner material layer 110 not covered by the shield electrode 114a can be removed to conformally form a liner layer 110a on the surface of the trench 108. The method of removing a portion of the liner material layer 110 is, for instance, a wet etching method.

Figure 2D:
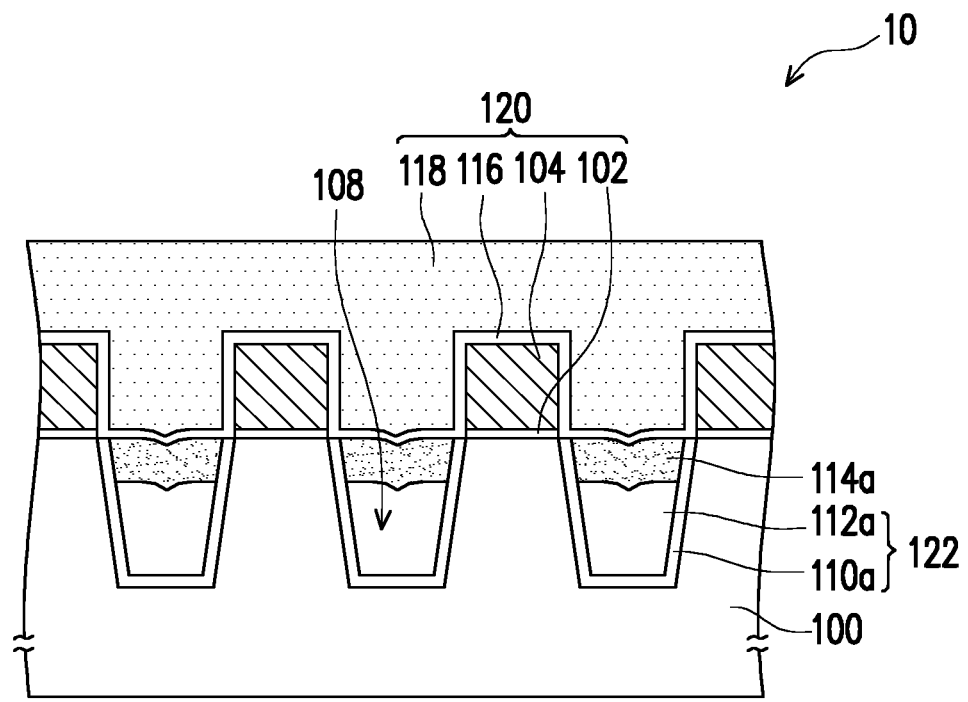

Referring to FIG. 2D, the dielectric layer 116 can be formed on the charge storage layer 104. The dielectric layer 116 can be further formed on the shield electrode 114a. The material of the dielectric layer 116 is, for instance, silicon oxide. The forming method of the dielectric layer 116 is, for instance, a chemical vapor deposition method.

A conductor layer 118 can be formed on the dielectric layer 116. The conductor layer 118 can be used as a word line, and the conductor layer 118 located above the charge storage layer 104 can be used as a control gate. Moreover, the conductor layer 118 can be further formed on the dielectric layer 116 between the charge storage layers 104. The material of the conductor layer 118 can be doped polysilicon or a metal. The forming method of the conductor layer 118 includes, for instance, first forming a conductor material layer via a chemical vapor deposition method or a physical vapor deposition method, and then performing a patterning process on the conductor material layer.

Via the manufacturing method of the non-volatile memory structure 10, memory cells 120 can be formed on the substrate 100, an isolation layer 122 can be formed between the memory cells 120, and the shield electrode 114a can be formed on the isolation layer 122, wherein the shield electrode 114a is electrically connected to the source line 114b (refer to FIG. 1). In the following, the non-volatile memory structure 10 of the embodiments above is described via FIG. 1 and FIG. 2D.

Referring to FIG. 1 and FIG. 2D, the non-volatile memory structure 10 includes memory cells 120, at least one isolation layer 122, and at least one shield electrode 114a, and can further include a select gate 124, a select gate 126, and a bit line contact 128. In the present embodiment, the non-volatile memory structure 10 is exemplified by a planar non-volatile memory structure.

The memory cells 120 are disposed on a substrate 100. Each of the memory cells 120 can include a charge storage layer 104, a conductor layer 118, a dielectric layer 102, and a dielectric layer 116. The charge storage layer 104 is disposed on the substrate 100. The conductor layer 118 is disposed on the charge storage layer 104. Moreover, the conductor layer 118 can be further disposed between charge storage layers 104. The dielectric layer 102 is disposed between the charge storage layer 104 and the substrate 100. The dielectric layer 116 is disposed between the conductor layer 118 and the charge storage layer 104. Moreover, the dielectric layer 116 can be further disposed between the conductor layer 118 and the shield electrode 114a.

The isolation layer 122 is located between the memory cells 120. In the present embodiment, the isolation layer 122 can be disposed in the substrate 100 between the memory cells 120 and can be disposed between the shield electrode 114a and the substrate 100. The isolation layer 122 can include an isolation structure 112a and a liner layer 110a. The isolation structure 112a is disposed in the substrate 100 between the memory cells 120. The liner layer 110a can be disposed between the isolation structure 112a and the substrate 100 and can be disposed between the shield electrode 114a and the substrate 100.

The shield electrode 114a is disposed on the isolation layer 122 and electrically connected to a source line 114b. Moreover, referring to FIG. 1, the select gate 124 can be located between the conductor layer 118 and the source line 114b. The select gate 126 can be located between the conductor layer 118 and the bit line contact 128. The shield electrode 114a can be electrically insulated from the conductor layer 118, the select gate 124, and the select gate 126.

Moreover, the material, configuration, forming method, and efficacy . . . etc. of each component in FIG. 1 and FIG. 2D are described in detail in the embodiments above and are therefore not repeated herein.

It can be known from the embodiments above that, in the non-volatile memory structure 10 and the manufacturing method thereof, the shield electrode 114a electronically connected to the source line 114b can effectively reduce coupling interference, and therefore the durability and reliability of the memory device can be significantly increased.

FIG. 3A to FIG. 3J are cross sections of a manufacturing process of a vertical non-volatile memory structure of an embodiment of the invention.

Figure 3A:
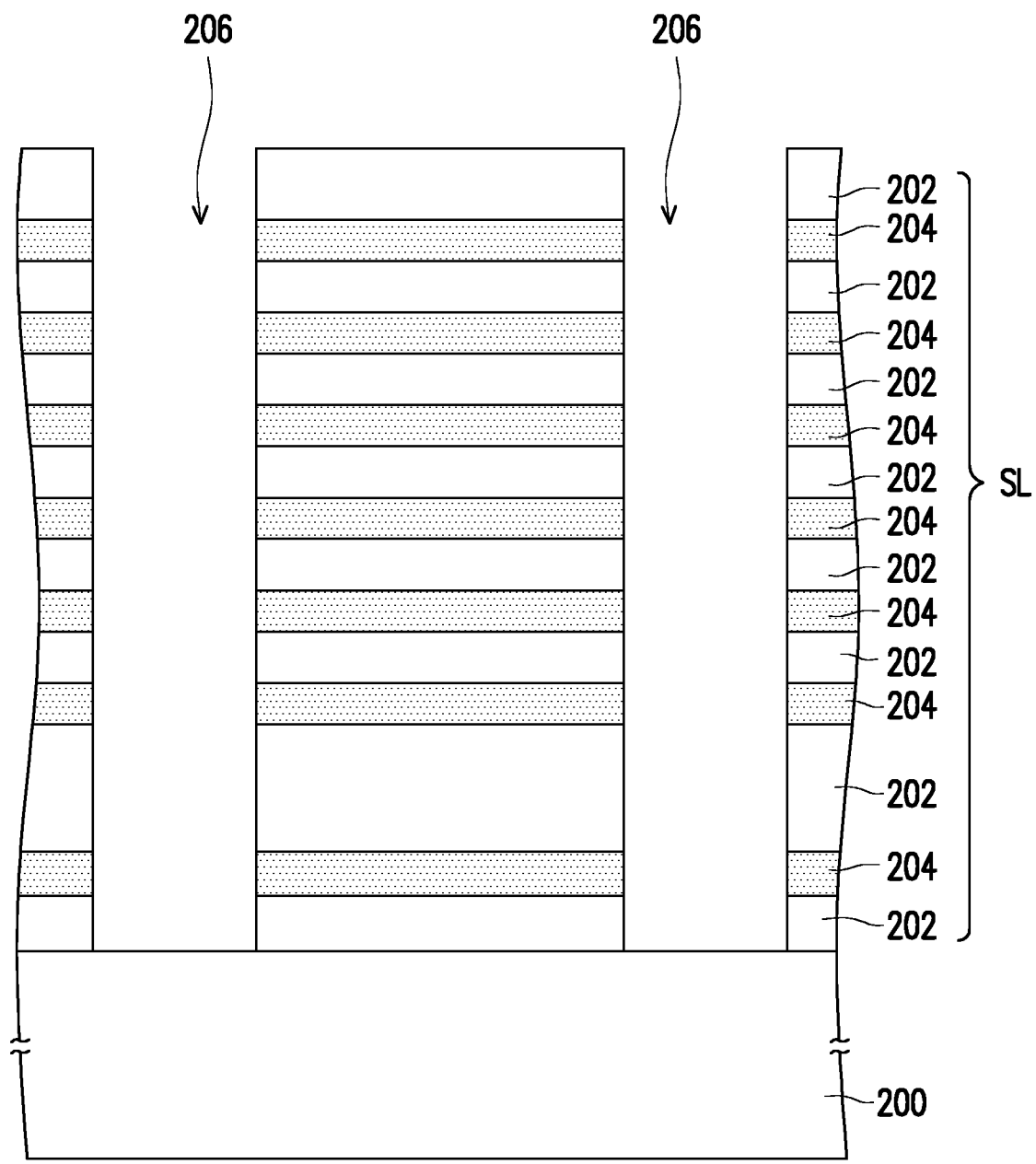
FIG. 3A to FIG. 3J are cross sections of a manufacturing process of a vertical non-volatile memory structure of an embodiment of the invention.

Referring to FIG. 3A, a substrate 200 is provided. The substrate 200 can be a semiconductor substrate such as a silicon substrate. Moreover, those having ordinary skill in the art can form a desired doped region (not shown) in the substrate 200 based on product design requirement.

A stacked layer SL can be formed on the substrate 200, wherein the stacked layer SL includes sacrificial layers 202 and sacrificial layers 204 that are alternately stacked. In the present embodiment, the topmost layer and the bottommost layer of the stacked layer SL can be the sacrificial layers 202. The material of the sacrificial layers 202 is, for instance, silicon oxide. The material of the sacrificial layers 204 is, for instance, silicon nitride. The sacrificial layers 202 and the sacrificial layers 204 are, for instance, respectively formed by a chemical vapor deposition method.

An opening 206 can be formed in the stacked layer SL, wherein the opening 206 exposes the substrate 200. The forming method of the opening 206 includes, for instance, performing a patterning process on the sacrificial layers 202 and the sacrificial layers 204.

Figure 3B:
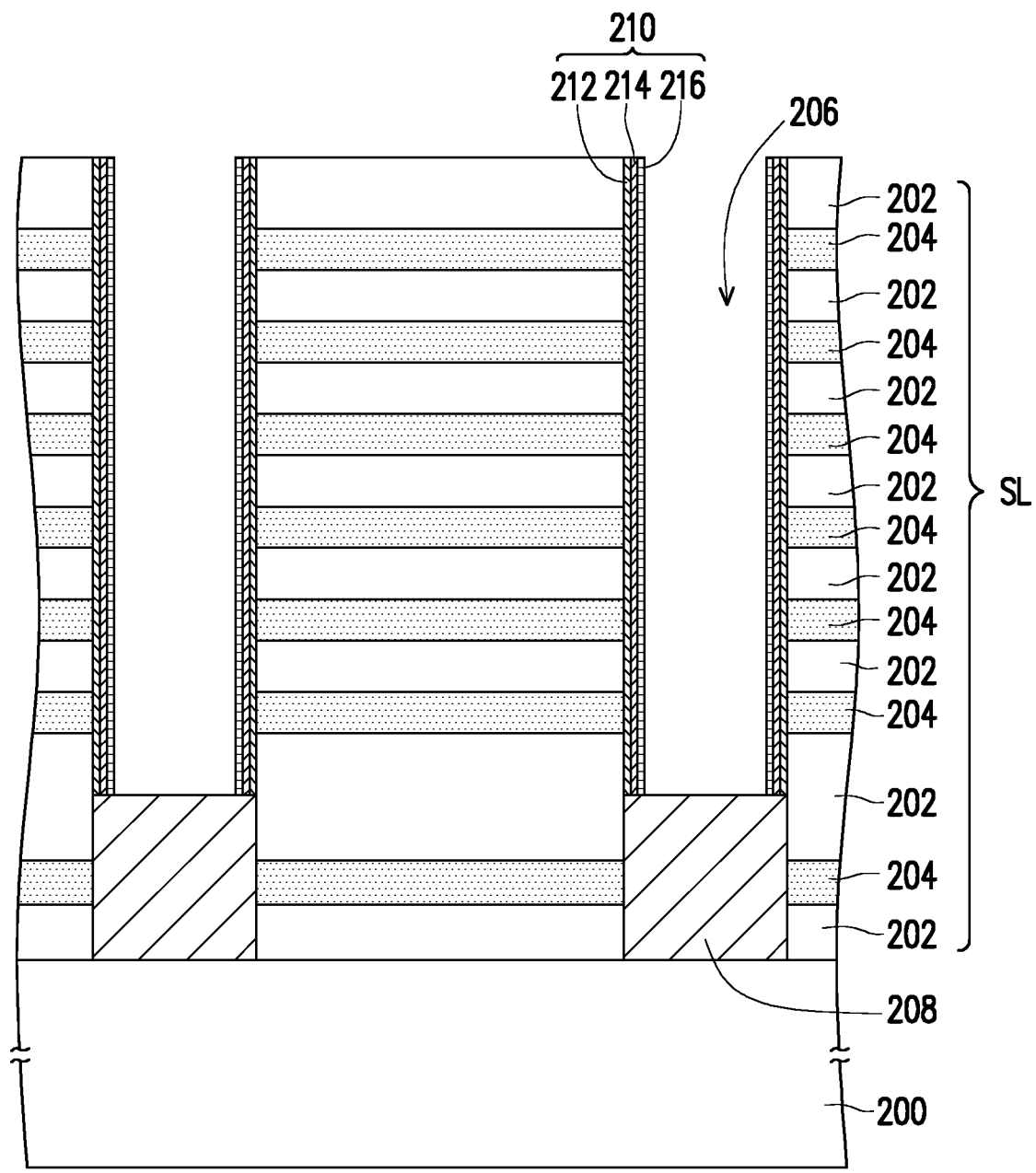

Referring to FIG. 3B, an epitaxial silicon layer 208 filled in the opening 206 can be formed on the substrate 200 exposed by the opening 206. The epitaxial silicon layer 208 can be used as a channel layer. The forming method of the epitaxial silicon layer 208 is, for instance, an epitaxial growth method. In the present embodiment, the top surface of the epitaxial silicon layer 208 is, for instance, higher than the top surface of the bottommost sacrificial layer 204 and lower than the bottom surface of the second sacrificial layer 204 from the bottom.

A charge storage structure layer 210 can be formed on a sidewall of the opening 206. The forming method of the charge storage structure layer 210 can include forming a dielectric layer 212, a charge storage layer 214, and a dielectric layer 216 in order on a sidewall of the opening 206. The material of the dielectric layer 212 is, for instance, silicon oxide. The material of the charge storage layer 214 is, for instance, silicon nitride. The material of the dielectric layer 216 is, for instance, silicon oxide. The forming method of the dielectric layer 212, the charge storage layer 214, and the dielectric layer 216 includes, for instance, first forming a conformal first dielectric material layer, charge storage material layer, and second dielectric material layer using a chemical vapor deposition method, and then performing an etch-back process on the second dielectric material layer, the charge storage material layer, and the first dielectric material layer.

Figure 3C:
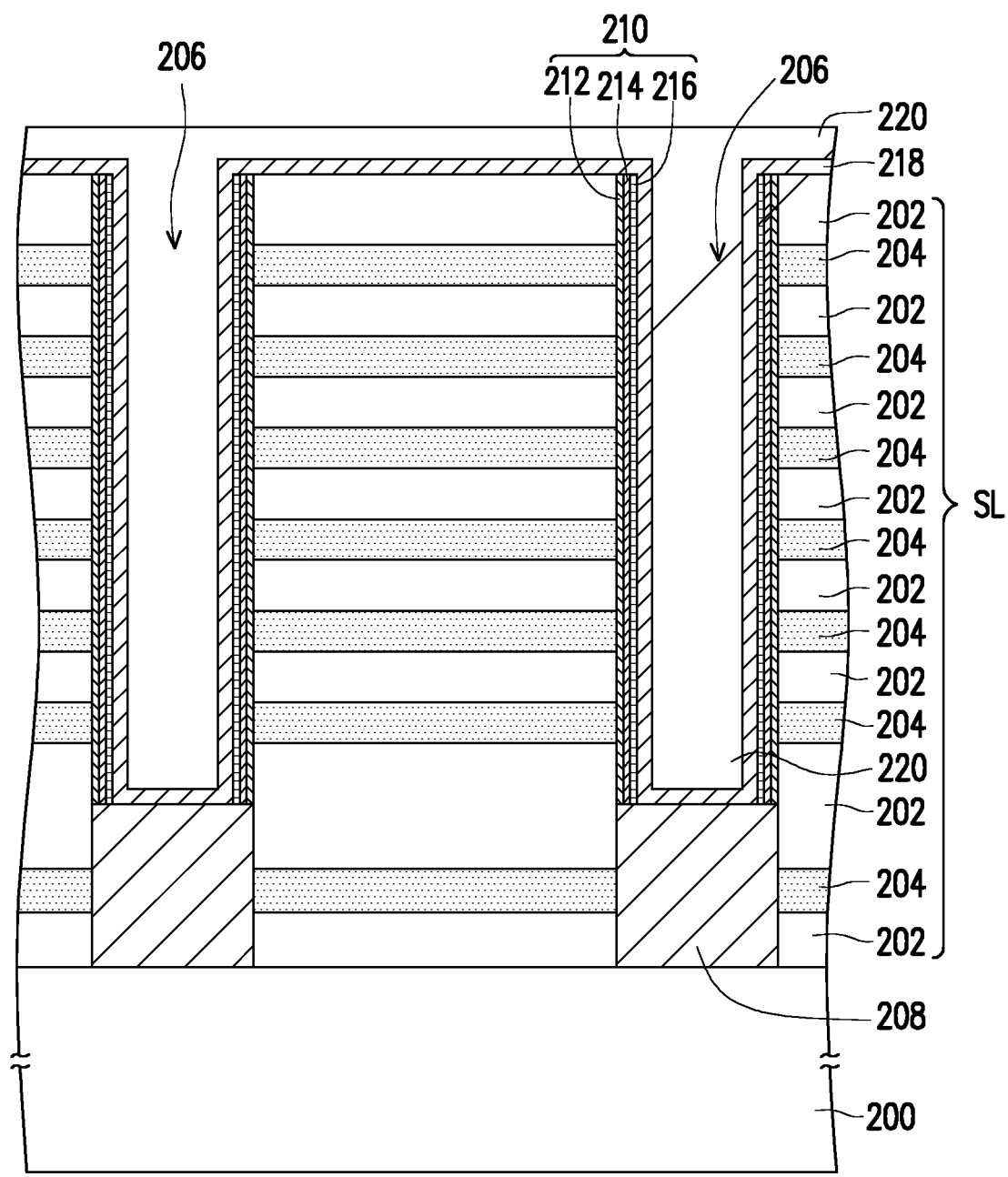

Referring to FIG. 3C, a channel material layer 218 can be formed on the charge storage structure layer 210. The channel material layer 218 can be connected to the epitaxial silicon layer 208. In another embodiment in which the epitaxial silicon layer 208 is not formed, the channel material layer 218 can be directly connected to the substrate 200. The material of the channel material layer 218 is, for instance, polysilicon. The forming method of the channel material layer 218 is, for instance, a chemical vapor deposition method.

A dielectric layer 220 completely filling the opening 206 can be formed. The material of the dielectric layer 220 is, for instance, silicon oxide. The forming method of the dielectric layer 220 is, for instance, a chemical vapor deposition method.

Figure 3D:
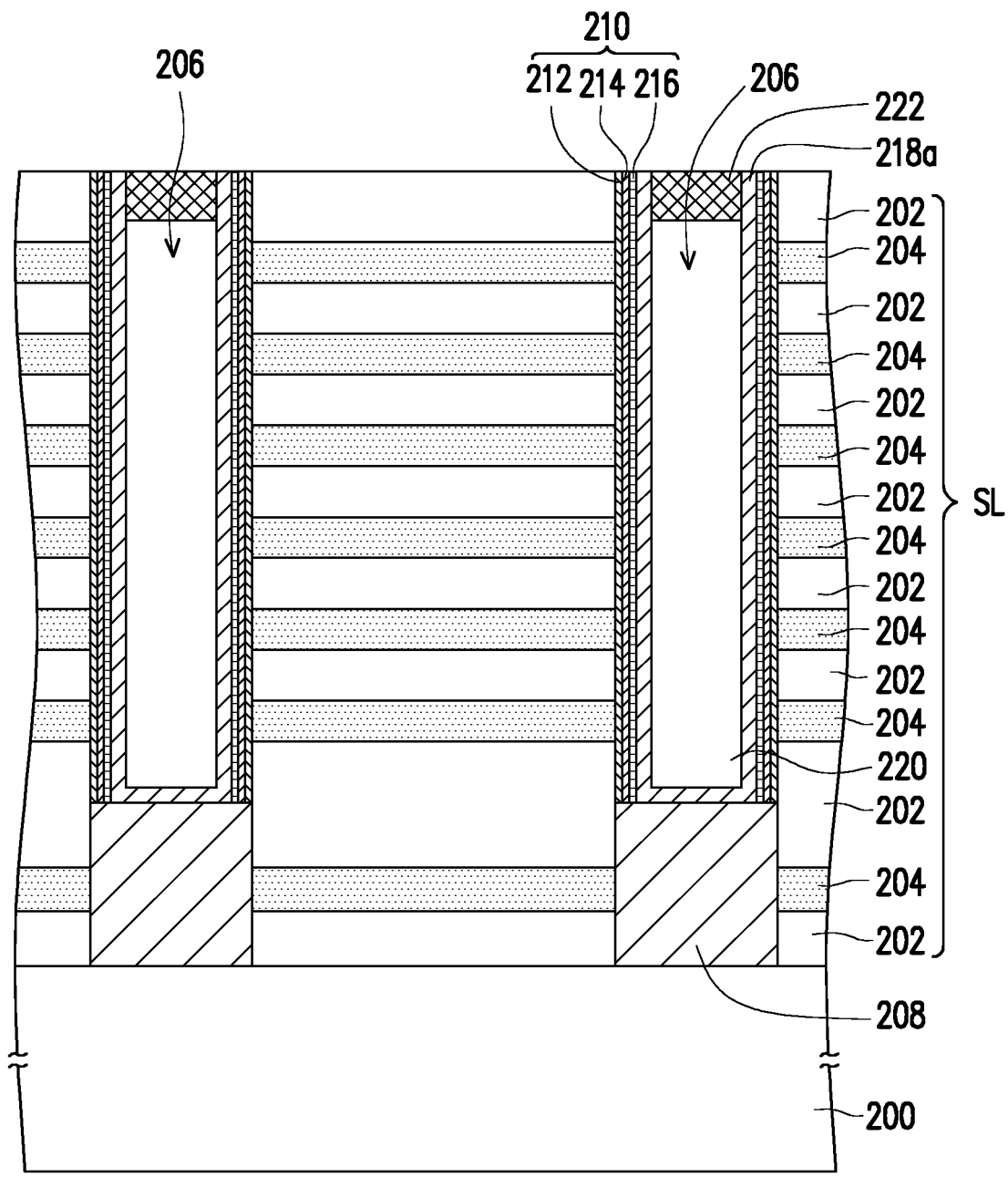

Referring to FIG. 3D, a portion of the dielectric layer 220 is removed such that the top surface of the dielectric layer 220 is lower than the top portion of the opening 206 and higher than the top surface of the topmost sacrificial layer 204. The method of removing the portion of the dielectric layer 220 is, for instance, a dry etching method or a wet etching method.

A pad 222 can be formed in the opening 206. The material of the pad 222 is, for instance, doped polysilicon. The forming method of the pad 222 includes, for instance, first forming a pad material layer completely filling the opening 206 via a chemical vapor deposition method, and then performing an etch-back process on the pad material layer.

The channel material layer 218 outside the opening 206 can be removed to form a channel layer 218a on the charge storage structure layer 210. In the present embodiment, the channel material layer 218 outside the opening 206 can be removed at the same time via the etch-back process performed on the pad material layer.

Figure 3E:
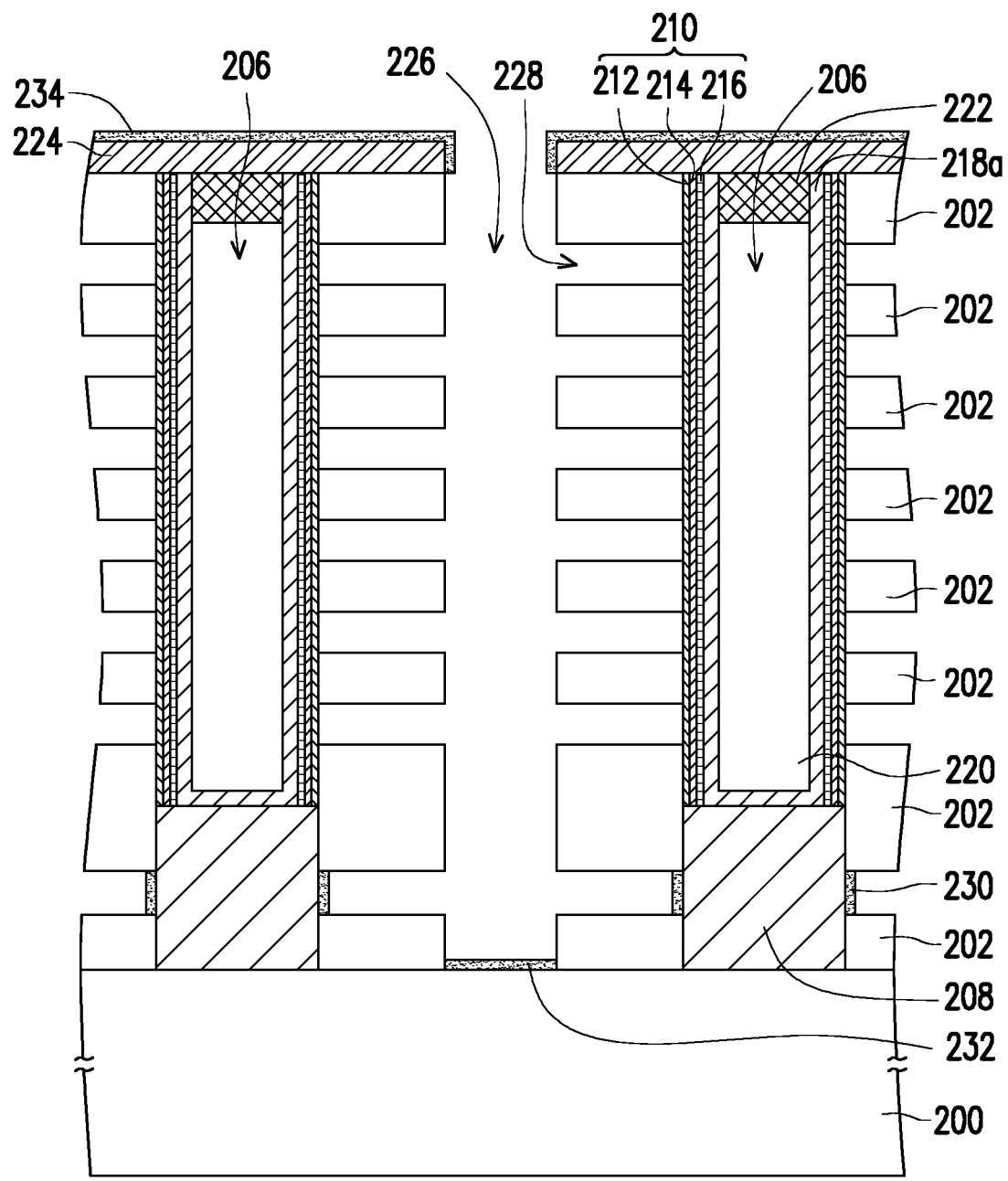

Referring to FIG. 3E, a patterned hard mask layer 224 is formed on the stacked layer SL. The patterned hard mask layer 224 covers the charge storage structure layer 210 and the channel layer 218a, and can further cover the pad 222. The material of the patterned hard mask layer 224 is, for instance, polysilicon. The forming method of the patterned hard mask layer 224 includes, for instance, first forming a hard mask layer via a chemical vapor deposition method, and then performing a patterning process on the hard mask layer.

An opening 226 can be formed in the stacked layer SL by using the patterned hard mask layer 224 as a mask. The opening 226 exposes the substrate 200. The forming method of the opening 226 includes, for instance, performing a dry etching process on the sacrificial layers 202 and the sacrificial layers 204 by using the patterned hard mask layer 224 as a mask.

The sacrificial layer 204 exposed by the opening 226 can be removed to form openings 228. The method of removing the sacrificial layer 204 is, for instance, a wet etching method. Moreover, the bottommost opening 228 can expose a portion of the epitaxial silicon layer 208.

A dielectric layer 230 can be formed on the epitaxial silicon layer 208 exposed by the openings 228, a dielectric layer 232 can be further formed on the substrate 200 exposed by the openings 226, and a dielectric layer 234 can be further formed on the patterned hard mask layer 224. The material of the dielectric layer 230, the dielectric layer 232, and the dielectric layer 234 is, for instance, silicon oxide. The forming method of the dielectric layer 230, the dielectric layer 232, and the dielectric layer 234 is, for instance, a thermal oxidation method.

Figure 3F:
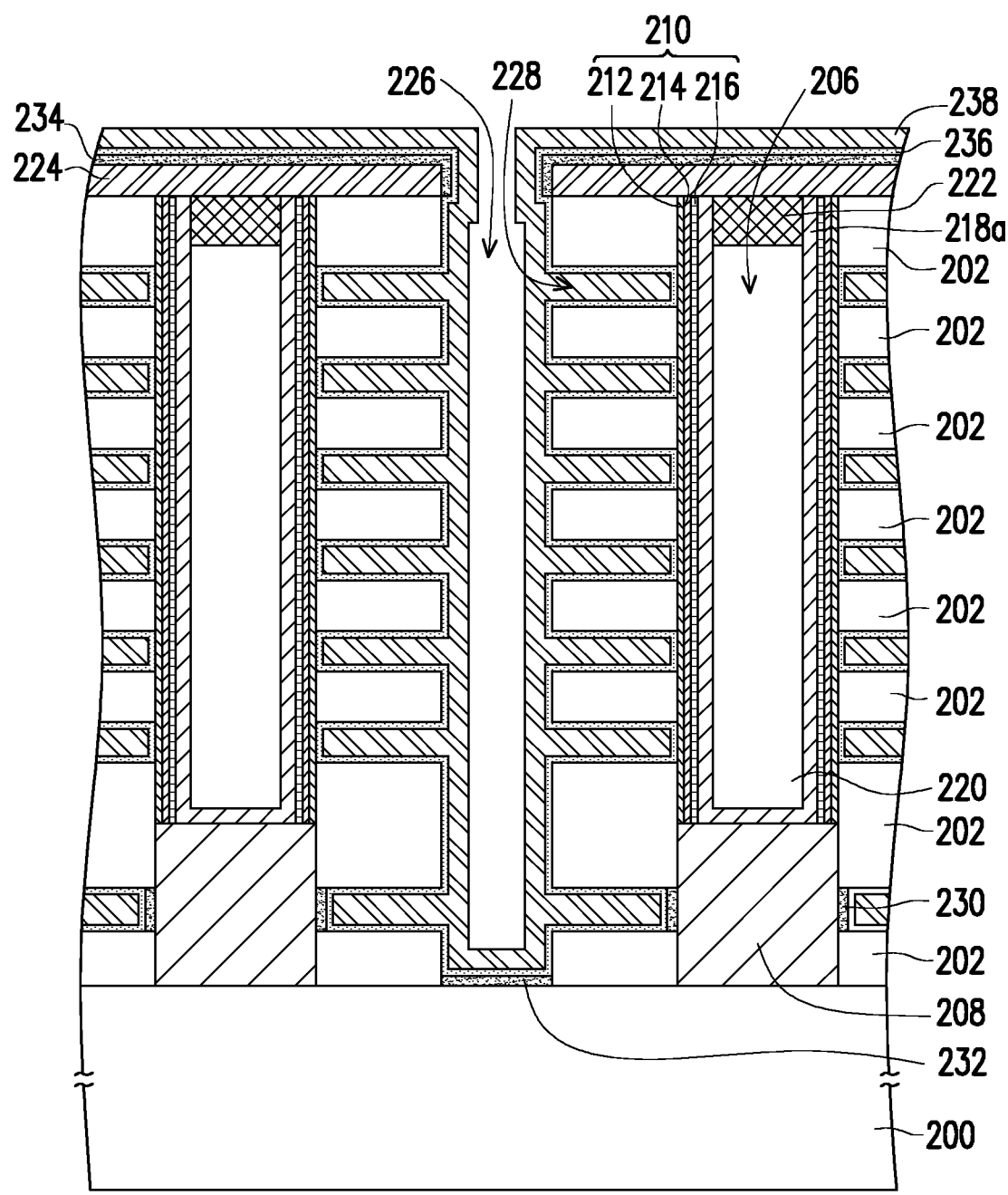

Referring to FIG. 3F, a barrier material layer 236 can be conformally formed in the openings 228. The material of the barrier material layer 236 is, for instance, TiN, WN, TaN, TiAl, TiAlN, or TaCN. The forming method of the barrier material layer 236 is, for instance, an atomic layer deposition (ALD) method.

A metal gate material layer 238 filled in the openings 228 can be formed on the barrier material layer 236. The material of the metal gate material layer 238 is, for instance, tungsten, copper, or aluminum. The forming method of the metal gate material layer 238 is, for instance, an atomic layer deposition (ALD) method.

Figure 3G:
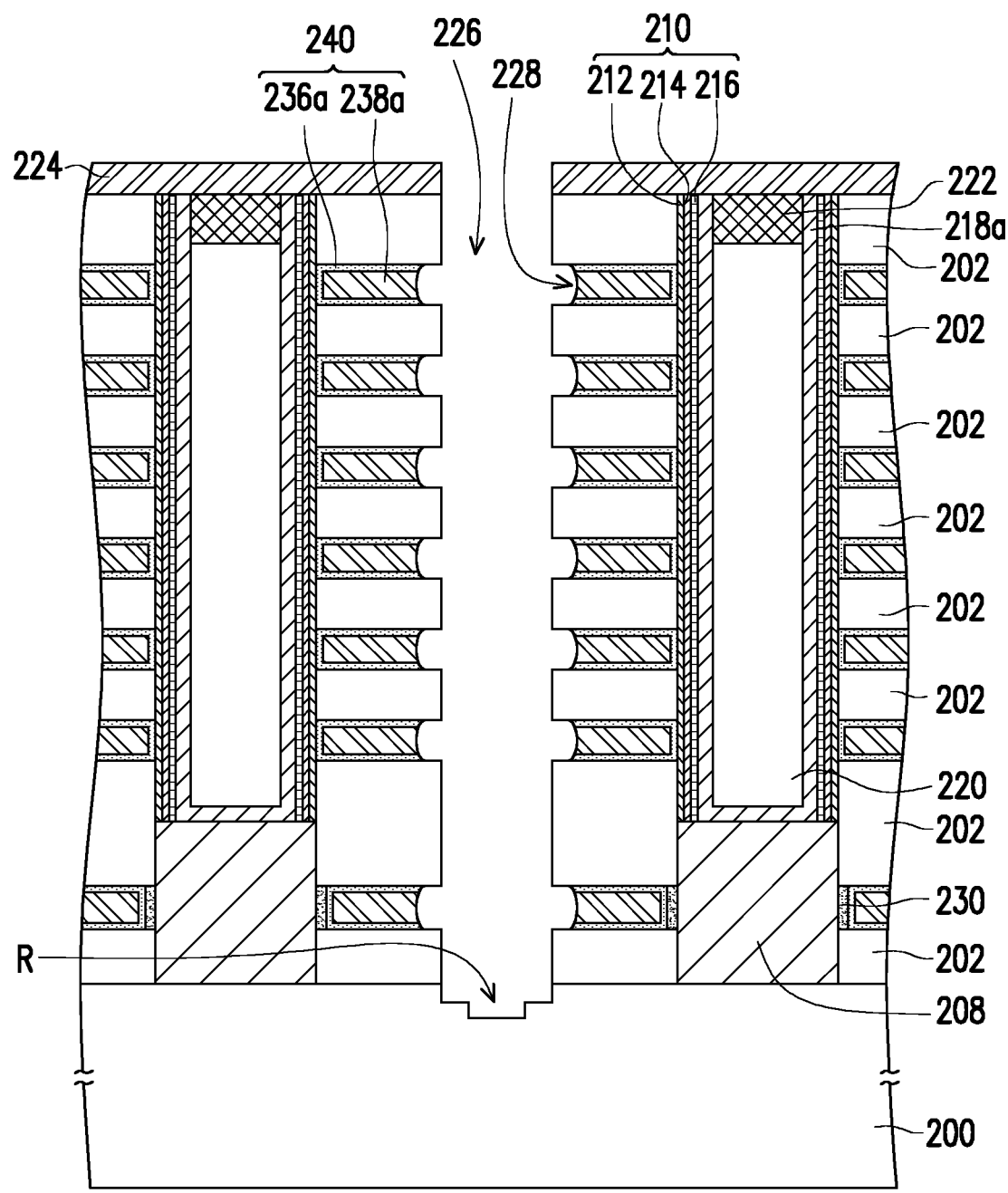

Referring to FIG. 3G, an etch-back process is performed on the metal gate material layer 238 and the barrier material layer 236 to form a barrier layer 236a and a metal gate 238a. Accordingly, a gate structure 240 can be formed in the openings 228. The gate structure 240 can include a barrier layer 236a and a metal gate 238a. In stacked gate structures 240, the topmost and bottommost gate structures 240 can be used as select gates, and the rest of the gate structures 240 can be used as control gates.

During the etch-back process performed on the metal gate material layer 238 and the barrier material layer 236, the dielectric layer 232 and the dielectric layer 234 can be removed at the same time, and a portion of the substrate 200 may be removed to form a recess R.

Figure 3H:
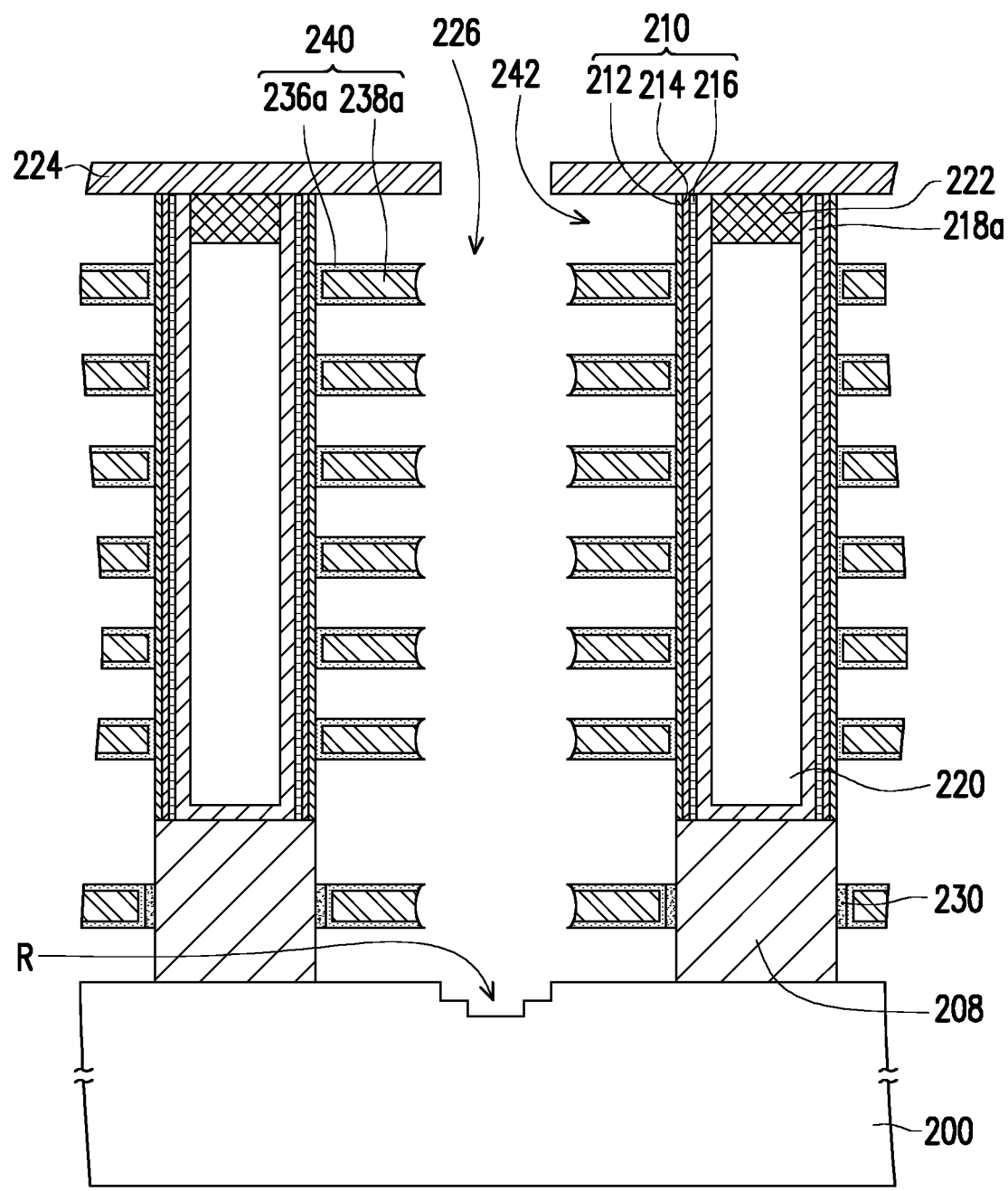

Referring to FIG. 3H, the sacrificial layers 202 exposed by the opening 226 are removed to form an opening 242. The method of removing the sacrificial layers 202 is, for instance, a wet etching method.

Figure 3I:
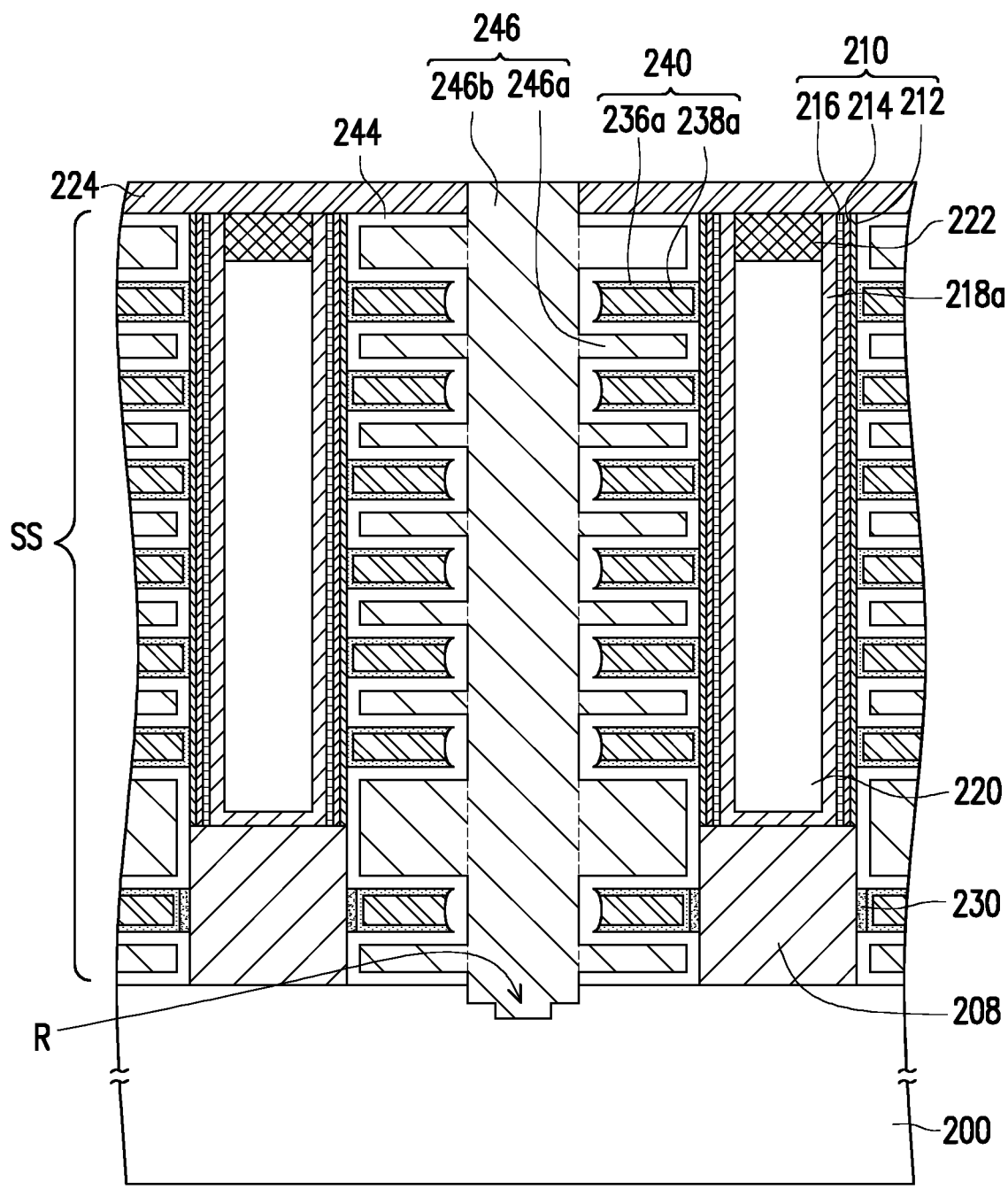

Referring to FIG. 3I, an isolation layer 244 is conformally formed on a surface of the opening 242 and on the gate structures 240. The material of the isolation layer 244 is, for instance, silicon oxide. The forming method of the isolation layer 244 is, for instance, an atomic layer deposition (ALD) method.

A shield electrode 246a is formed on the isolation layer 244 in the opening 242, and a source line 246b connected to the shield electrode 246a and the substrate 200 is formed in the opening 226. The material of the shield electrode 246a and the source line 246b is, for instance, tungsten, copper, or aluminum. The shield electrode 246a and the source line 246b can be formed by the conductor layer 246. For instance, the forming method of the conductor layer 246 can include the following steps, but the invention is not limited thereto. A conductor material layer completely filling the opening 242 is formed, and then an etch-back process is performed on the conductor material layer to remove the conductor material layer outside the opening 242. During the etch-back process performed on the conductor material layer, the isolation layer 244 exposed by the opening 226 can be removed at the same time such that the isolation layer 244 exposes the substrate 200. A conductor material layer completely filling the opening 226 is formed. A conductor material layer outside the opening 226 is removed. The forming method of the conductor material layer is, for instance, a chemical vapor deposition method. The method of removing the conductor material layer outside the opening 226 includes, for instance, performing a chemical-mechanical polishing process or an etch-back process on the conductor material layer by using the top portion of the patterned hard mask layer 224 as a stop layer.

Accordingly, a stacked structure SS including the shield electrode 246a, the gate structures 240, and at least one isolation layer 244 can be formed on the substrate 200. The shield electrodes 246a and the gate structures 240 are alternately stacked, and the isolation layer 244 is located between the shield electrode 246a and the gate structure 240.

Figure 3J:
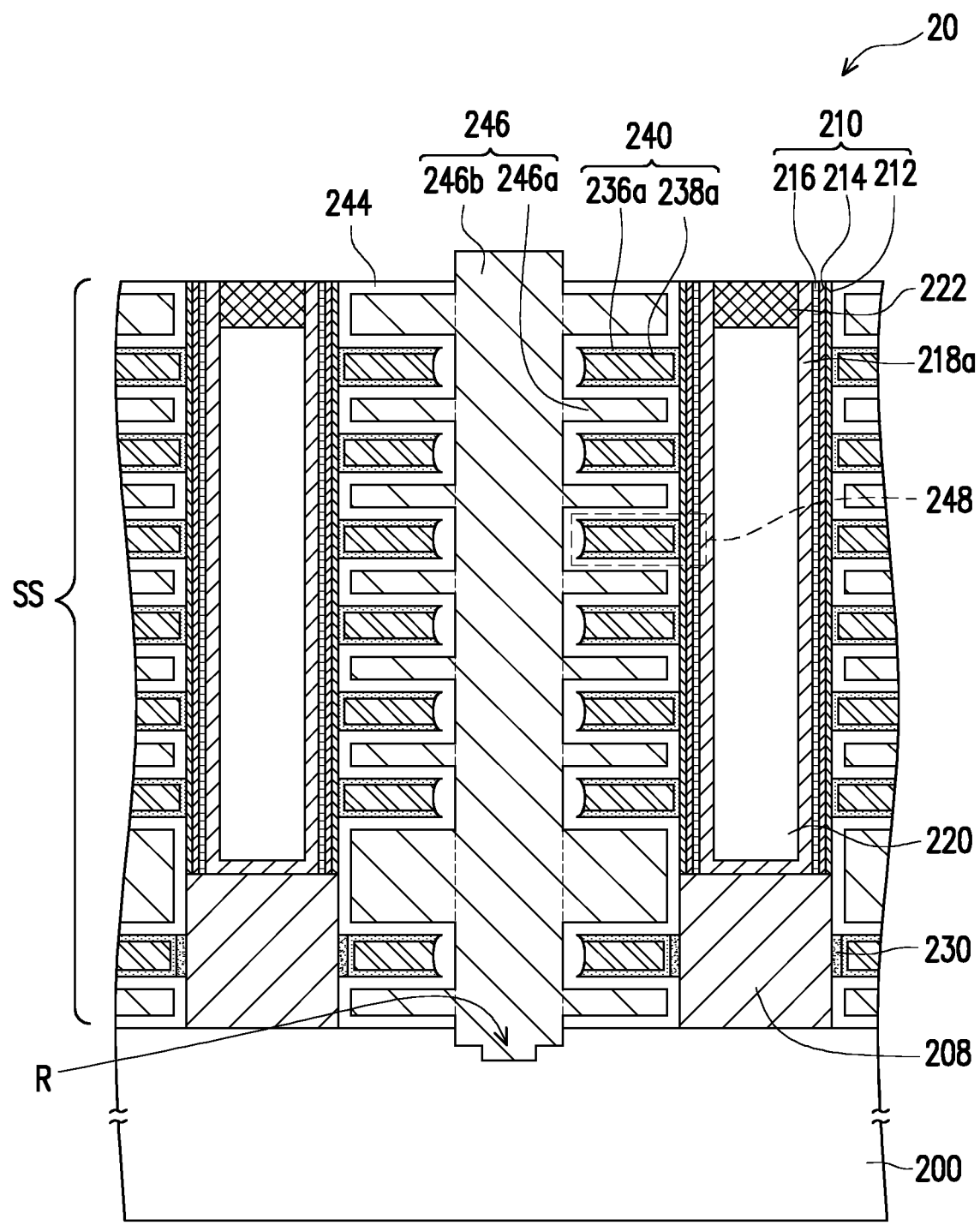

Referring to FIG. 3J, the patterned hard mask layer 224 can be removed. The method of removing the patterned hard mask layer 224 is, for instance, a dry etching method, a wet etching method, or a combination thereof.

Via the manufacturing method of a non-volatile memory structure 20 above, memory cells 248 can be formed on the substrate 200, an isolation layer 244 can be formed between the memory cells 248, and a shield electrode 246a can be formed on the isolation layer 244, wherein the shield electrode 246a is electrically connected to the source line 246b. In the following, the non-volatile memory structure 20 of the embodiments above is described via FIG. 3J.

Referring to FIG. 3J, the non-volatile memory structure 20 includes memory cells 248, at least one isolation layer 244, and at least one shield electrode 246a. The memory cells 248 are disposed on a substrate 200. The memory cell 248 can include the gate structure 240 and a portion of the charge storage structure layer 210 located at a side of the gate structure 240. The isolation layer 244 is located between the memory cells 248. The shield electrode 246a is disposed on the isolation layer 244 and electrically connected to the source line 246b. In the present embodiment, the non-volatile memory structure 20 is exemplified by a vertical non-volatile memory structure.

Specifically, the non-volatile memory structure 20 can include a stacked structure SS, a channel layer 218a, and a charge storage structure layer 210. The stacked structure SS is disposed on the substrate 200 and can include at least one shield electrode 246a, gate structures 240, and at least one isolation layer 244. The shield electrodes 246a and the gate structures 240 are alternately stacked, and the isolation layer 244 is located between the shield electrode 246a and the gate structure 240. The gate structures 240 can include a metal gate layer 238a and a barrier layer 236a. The barrier layer 236a is located between the metal gate layer 238a and the charge storage structure layer 210. The channel layer 218a is disposed on a sidewall at a side of the stacked structure SS. The charge storage structure layer 210 is disposed between the stacked structure SS and the channel layer 218a. The charge storage structure layer 210 can include the dielectric layer 212, the charge storage layer 214, and the dielectric layer 216 disposed on a sidewall of the stacked structure SS in order.

Moreover, the non-volatile memory structure 20 can further include at least one of the epitaxial silicon layer 208, the dielectric layer 220, the pad 222, the dielectric layer 230, and the source line 246b. The epitaxial silicon layer 208 is disposed on the substrate 200 at a side of the stacked structure SS. The dielectric layer 220 is disposed on a sidewall of the channel layer 218a away from the side of the stacked structure SS. The pad 222 is disposed on the dielectric layer 220 and connected to the channel layer 218a. The dielectric layer 230 is disposed between the epitaxial silicon layer 208 and the gate structures 240. The source line 246b can be disposed on a sidewall at another side of the stacked structure SS and connected to the substrate 200. The isolation layer 244 can be further located between the source line 246b and the gate structures 240.

Moreover, the material, configuration, forming method, and efficacy . . . etc. of each component in FIG. 3J are described in detail in the embodiments above and are therefore not repeated herein.

It can be known from the embodiments above that, in the non-volatile memory structure 20 and the manufacturing method thereof, the shield electrode 246a electronically connected to the source line 246b can effectively reduce coupling interference, and therefore the durability and reliability of the memory device can be significantly increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A manufacturing method of a non-volatile memory structure, comprising:
    forming memory cells on a substrate;
    forming at least one isolation layer between the memory cells;
    forming at least one shield electrode on the at least one isolation layer, wherein the at least one shield electrode is electrically connected to a source line; and wherein the non-volatile memory structure is a vertical non-volatile memory structure, and a manufacturing method of the vertical non-volatile memory structure comprises: forming a stacked layer on the substrate, wherein the stacked layer comprises first sacrificial layers and second sacrificial layers that are alternately stacked; forming a first opening in the stacked layer, wherein the first opening exposes the substrate; forming a charge storage structure layer on a sidewall of the first opening; forming a channel layer on the charge storage structure layer; forming a patterned hard mask layer on the stacked layer, wherein the patterned hard mask layer covers the charge storage structure layer and the channel layer; forming a second opening in the stacked layer by using the patterned hard mask layer as a mask, wherein the second opening exposes the substrate; removing the second sacrificial layers exposed by the second opening to form third openings; forming gate structures in the third openings; removing the first sacrificial layers exposed by the second opening to form fourth openings; conformally forming the at least one isolation layer on a surface of the fourth openings and on the gate structures; and forming the at least one shield electrode on the at least one isolation layer in the fourth openings and forming the source line connected to the at least one shield electrode and the substrate in the second opening.
2. The manufacturing method of the non-volatile memory structure of claim 1, wherein the non-volatile memory structure is a vertical non-volatile memory structure, and a manufacturing method of the vertical non-volatile memory structure comprises:

forming a stacked layer on the substrate, wherein the stacked layer comprises first sacrificial layers and second sacrificial layers that are alternately stacked;

forming a first opening in the stacked layer, wherein the first opening exposes the substrate;

forming a charge storage structure layer on a sidewall of the first opening;

forming a channel layer on the charge storage structure layer;

forming a patterned hard mask layer on the stacked layer, wherein the patterned hard mask layer covers the charge storage structure layer and the channel layer;

forming a second opening in the stacked layer by using the patterned hard mask layer as a mask, wherein the second opening exposes the substrate;

removing the second sacrificial layers exposed by the second opening to form third openings;

forming gate structures in the third openings;

removing the first sacrificial layers exposed by the second opening to form fourth openings;

conformally forming the at least one isolation layer on a surface of the fourth openings and on the gate structures; and forming the at least one shield electrode on the at least one isolation layer in the fourth openings and forming the source line connected to the at least one shield electrode and the substrate in the second opening.

3. The manufacturing method of the non-volatile memory structure of claim 1, wherein the memory cells comprise the gate structures and a portion of the charge storage structure layer located at a side of the gate structures.

4. The manufacturing method of the non-volatile memory structure of claim 1, wherein a forming method of the gate structures comprises:

conformally forming a barrier material layer in the third openings;

forming a metal gate material layer filled in the third openings on the barrier material layer; and performing an etch-back process on the metal gate material layer and the barrier material layer.

* * * * *